United States Patent [19]

Lorenzetti et al.

[11] Patent Number: 4,899,210

[45] Date of Patent: Feb. 6, 1990

[54] HEAT SINK

[75] Inventors: Victor Lorenzetti, Dedham; Manuel Pontes, Somerville, both of Mass.

[73] Assignee: Wakefield Engineering, Inc., Wakefield, Mass.

[21] Appl. No.: 146,213

[22] Filed: Jan. 20, 1988

[51] Int. Cl.$^4$ .................... H01L 23/34; H01L 23/36
[52] U.S. Cl. ..................................................... 357/81
[58] Field of Search .................... 357/81, 82; 361/382, 361/385; 165/80.4

[56] References Cited

U.S. PATENT DOCUMENTS

| | | | |
|---|---|---|---|
| 4,541,004 | 9/1985 | Moore | 357/81 |
| 4,733,293 | 3/1988 | Gabuzda | 357/81 |

FOREIGN PATENT DOCUMENTS

| | | | |
|---|---|---|---|
| 0204001 | 11/1983 | Fed. Rep. of Germany | 357/81 |
| 0019658 | 2/1979 | Japan | 357/81 |
| 0053446 | 4/1980 | Japan | 357/81 |

OTHER PUBLICATIONS

Data sheet for EG&G Wakefield Engineering, Components Division, Series 830, Heat Sink.
Data Sheet for EG&G Wakefield Engineering, Components Division, Series 680, Heat Sink.
Literature concerning Thermalloy Inc. heat sinks.

Primary Examiner—Rolf Hille
Assistant Examiner—S. V. Clark
Attorney, Agent, or Firm—Wolf, Greenfield & Sacks

[57] ABSTRACT

A heat sink adapted for use with VLSI and other integrated circuit elements which includes a base adapted to be in thermal contact with the element to be cooled, there preferably being at least one projection from the side of the base adapted to be adjacent to the element, and a plurality of pins extending from the other side of the base in a direction substantially perpendicular thereto. The projection from the base may either be in the form of a center pedestal which is secured to the element to be cooled by a suitable adhesive, limiting the thermal stress area, or may be a plurality of projections formed in a predetermined pattern which are adapted to be in physical contact with the element and to provide a controlled standoff therefrom which defines a uniform adhesive bond line. The heat sink also preferably provides a means for reducing the temperature gradient between the center pins and peripheral pins which results from the center of the integrated circuit typically being hotter than the outer areas. For a preferred embodiment, this is accomplished by having a dish-shaped base which provides improved heat transfer to the outer pins.

21 Claims, 1 Drawing Sheet

HEAT SINK

FIELD OF THE INVENTION

This invention relates to heat sinks and more particularly, to heat sinks adapted for use with VLSI (very large scale integration) or other integrated circuit packages or devices.

BACKGROUND OF THE INVENTION

As VLSI and other integrated circuit packages and devices have become smaller, with shorter circuit traces and increased internal signal speeds, greater power density has resulted, causing increased heating of the devices and a need for improved heat sinking and better thermal management. Three methods are commonly employed for providing such thermal management. These methods are natural convection, which relies on air flow for cooling without any external forces applied to the air; forced convection where fans or blowers move air in a direction parallel to the surface of the element from which heat is being removed; and impingement cooling where the air is blown at the element to be cooled in a direction perpendicular to its surface.

Typically, heat sinks are provided with each of the three methods to improve the removal of heat from the element. While cooling fins or vanes have been employed for this purpose, cooling pins are preferably utilized with small elements, such as integrated circuits, because of their superior performance for a given volume.

Numerous pin-type heat sinks are currently on the market including many designed for use with integrated circuits. However, there are various problems unique to integrated circuits which are not fully addressed by existing devices. First, the heat generated by an integrated circuit is greatest at the center of the device and decreases toward the outer periphery. However, since the rate of heat dissipation by a heat sink is a function of the temperature gradient between the heat sink and the surrounding air, heat transfer from the heat sink can be improve if all the pins of the heat sink are at a relatively higher temperature rather than just a few pins near the center. It is therefore desirable to design the heat sink so as to reduce the temperature gradient between the center pins and those pins closer to the outer periphery.

Another desirable feature is that a single heat sink be available for use for all three methods of cooling, and that such heat sink be omnidirectional. This, for example, permits the heat sinks to be applied by the integrated circuit manufacturer or by the OEM manufacturer without regard to how the circuits will be oriented or cooled.

Another problem with integrated circuits is that the ceramic of the casing for the integrated circuit package and the metal typically employed for heat sinks have different thermal expansion and contraction characteristics. If there is a substantial area of contact between the two, and this area is fairly rigid, this difference can result in the cracking of the casing and thus in the destruction of the integrated circuit. It is therefore desirable to minimize the area of contact between the heat sink and the circuit package while still providing sufficient contact area for effective heat transfer. Finally, in order to assure uniform heat transfer between the circuit package and the heat sink, it is desirable that there be a controlled adhesive bond line between the members.

A need therefore exists for a heat sink for use with VLSI and other integrated circuit packages, or other similar elements which is designed to reduce the temperature gradient between the center and outer pins of the heat sink, which is adapted for use with all three methods of cooling, which minimizes adhesive bonding surface contact between the heat sink and the VLSI package while still providing effective heat transfer, and which is adapted for providing a controlled adhesive bond line between the heat sink and the element to be cooled.

SUMMARY OF THE INVENTION

In accordance with the above, this invention provides a heat sink adapted for use with VLSI and other integrated circuit elements. The heat sink includes a base adapted to be in thermal contact with the element to be cooled and a plurality of pins extending substantially perpendicular from the base, the pins being arranged in a predetermined pattern. The base and pins may be formed of a single substantially homogeneous piece of material, the material preferably being a metal. For a preferred embodiment, the heat sink is formed by being cast and the metal is a metal which is particularly adapted to be cast. The pin pattern is preferably symmetrical, causing the heat sink to be omnidirectional, and is preferably staggered. The base preferably has at least one integral projection on the side thereof adjacent to the element to be cooled. The projection may be a single center pedestal which is adapted to be bonded to the element, or may be formed in a predetermined pattern and adapted to be in contact with the element. The height of the latter projections may be substantially equal to the desired adhesive bond line thickness between the heat sink and the element, providing a controlled space standoff for the adhesive. For most elements, the portion of the element in thermal contact with the center of the heat sink is normally hotter than the portions in contact with the outer peripheral areas of the heat sink. The heat sink thus includes means for reducing the temperature gradient between the center pins and those furthest from the center. For a preferred embodiment, the temperature gradient reducing means includes the base being shaped to provide an improved heat conduction path to the pins extending from the outer portions of the base. Preferably the base is dish-shaped with its thickness gradually increasing in a predetermined way from the center to the periphery.

The foregoing and other objects, features and advantages of the invention will be apparent from the following more particular description of preferred embodiments of the invention as illustrated in the accompanying drawing.

DETAILED DESCRIPTION

Figure 1:
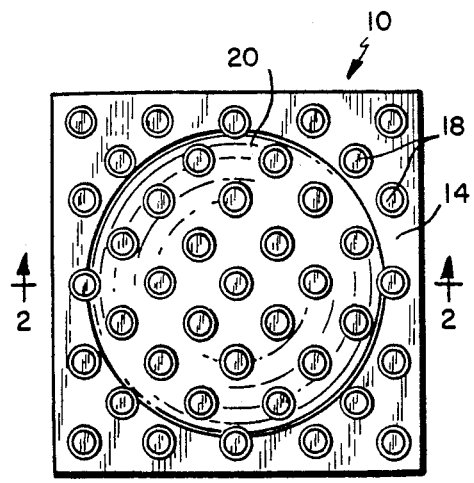
FIG. 1 is a top view of a first embodiment of the invention.
Figure 2:
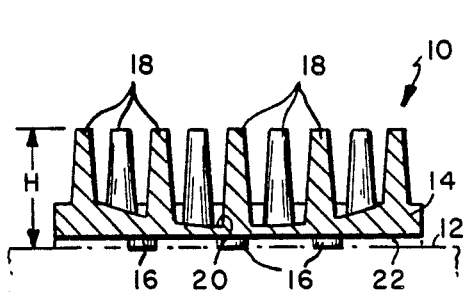
FIG. 2 is a cutaway side view taken along the line 2—2 in FIG. 1.
Figure 3:
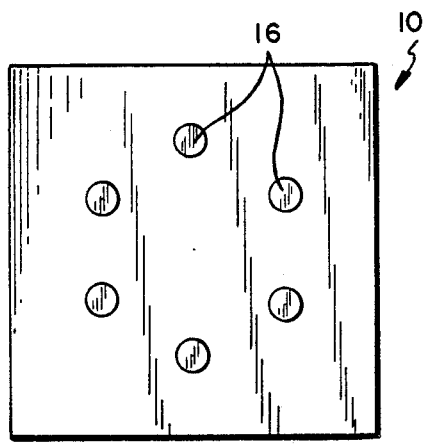
FIG. 3 is a bottom view of the heat sink shown in FIGS. 1 and 2.

Referring first to FIGS. 1-3, a heat sink 10 is shown which is adapted for use to remove heat from an integrated circuit element 12. As previously indicated, element 12 may be a VLSI or other integrated circuit package or similar element requiring cooling. Heat sink 10 consists of a base 14 having projections 16 extending from the side thereof which is adapted to be adjacent to element 12 and a plurality of pins 18 extending from the opposite side thereof. The pins 18 extend in a direction substantially perpendicular to the bottom surface of the base. Base 14 is generally dish-shaped, having a curved indentation 20 formed in its upper surface. Base 14, projections 16, and pins 18 are formed of a single integral piece of material. Since the material from which the heat sink is formed must have a low thermal resistance, the material is preferably a metal.

Referring to FIG. 1, it is seen that pins 18 are formed in a symmetrical pattern on base 14, resulting in the heat sink being omnidirectional. Further, for reasons which will be discussed later, the pins are positioned such that, when entering the pin pattern from any side, the pins are staggered. As may be best seen in FIG. 2, while the bottoms of the pins conform to the dishshaped upper surface of base 14, the tops of all the pins 18 are in a common plane substantially parallel to the bottom surface of base 14. Thus, the pins near the center of the base are somewhat longer than the pins at the periphery of the base, the length of the pins progressively decreasing toward the periphery as the thickness of the base increases. Thus, the overall height H of the heat sink remains substantially constant regardless of the thickness of the base 14.

As may be best seen in FIGS. 2 and 3, projections 16 on the bottom of base 14 are in the form of a plurality of short pins arranged in a generally circular pattern. However, the projection shape and/or pattern may vary from that shown, depending on application.

For a preferred embodiment of the invention, heat sink 10 is formed by being die cast, mold cast or cast in some other standard manner. Thus, the metal selected as the material for the heat sink would be a metal or metallic alloy which is particularly adapted for being cast. If the heat sink is fabricated in another way, the material utilized could be a metal such as, for example, aluminum, copper or another material having a low thermal resistance.

Heat sink 10 is secured to element 12 by applying a suitable adhesive 22 to at least one of the members (i.e. the heat sink 10 or element 12) and bringing the members together under sufficient pressure to squeeze out any air trapped between the members and excess adhesive. The projections 16 provide a controlled standoff resulting in a consistent adhesive bondline thickness. The consistent bondline thickness produces controlled and uniform heat transfer between element 12 and base 14. The direct contact between projections 16 and element 12 also facilitates heat transfer between the element and heat sink.

One potential problem with the use of heat sinks such as the heat sink 10 is that the casing of the element 12 is normally formed of a material such as a ceramic, while the heat sink is typically formed of a metal. The temperature expansion and contraction coefficients of the materials for the element and the heat sink are thus sufficiently different that, when the two materials are bonded together, stresses may develop with changes in temperature. These stresses may result in the rupture of element 12, thus destroying the element. In accordance with the teachings of this invention, this problem is reduced by limiting the bonding area by use of the projections 16 and by using an adhesive having sufficient elasticity to minimize such stresses. Adhesives 22 found suitable for this purpose include most thin film adhesives and certain epoxy adhesives with filler materials such as silver.

For most integrated circuit devices, the center of the device is substantially hotter than the outer rim or periphery. For example, the center of the device 12 might be at a temperature in the range of 80° C., while the periphery may be at a temperature in the range of 65° C. Thus, without compensation, the pins 18 at the center of heat sink 10 would typically be much hotter than the pins at the outer periphery. However, since heat transfer from the heat sink, and in particular from pins 18 to the air passing over the pins, is a function of the average temperature gradient between the pins and the air, optimum heat transfer occurs if all of the pins are at their highest possible temperature.

To achieve the above objective, it is necessary that a heat conduction or transfer path be established to conduct heat from the center of the heat sink 10 toward the outer pins 18 of the heat sink to reduce the temperature gradient between the center pins and those toward the outer periphery. In accordance with the teachings of this invention, this objective is achieved through the dish-shaped configuration of base 14. This results in the base being thinnest at its center and becoming progressively thicker toward the periphery. Since heat flow at the center of the base is substantially one-dimensional in a vertical direction parallel to the center pins and becomes increasingly two-dimensional (i.e. both vertical and radial) toward the outer periphery of the base provides a progressively increasing cross-sectional area which, the dish shape of the base enhances heat flow to the outer peripheral areas of the base and thus to the outer peripheral pins, reducing the temperature gradient between the center pins and outer peripheral pins. The pins 18 near the center of the heat sink are also longer, permitting more heat to be dissipated from these pins and thus improving the overall heat transfer characteristics of the heat sink.

Two additional features in the design of heat sink 10 enhance heat transfer. First, the dish-shaped base enhances aerodynamic air flow over the pins, particularly with the impingement method of cooling, thus improving heat transfer. Second, the staggering of the pins in the array results in air turbulence as air flows through the pins. This turbulence prevents boundary layer buildup and thus results in improved heat transfer.

The dimensions of heat sink 10 will depend to some extent on the dimensions of the element 12 being cooled and on the spacing between elements when they are mounted on a rack, board, or the like. For example, for a standard 135-pin grid array, the heat sink base may be 1.45 inches square and might have a dimension H which varies from roughly one-third of an inch to roughly two-thirds of an inch, depending on such factors as the amount of heat dissipation required, available space, and method of cooling utilized.

Figure 4:
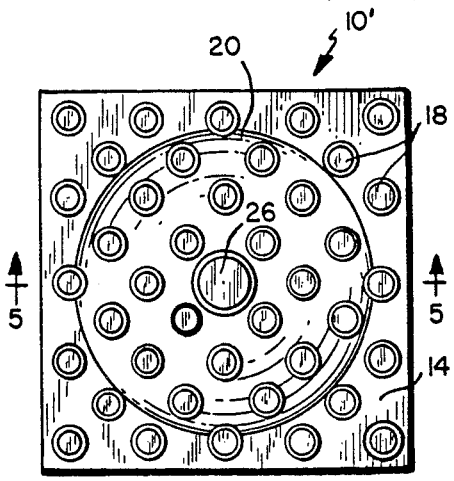
FIG. 4 is a top view of a second embodiment of the invention.
Figure 5:
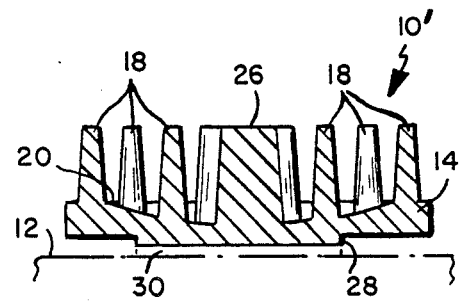
FIG. 5 is a cutaway side view taken along the line 5—5 in FIG. 4.
Figure 6:
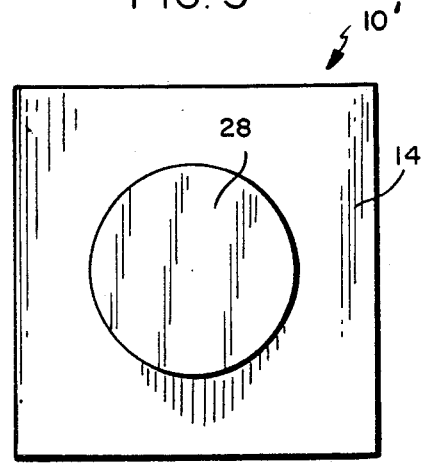
FIG. 6 is a bottom view of the embodiment of the invention shown in FIGS. 4 and 5.

FIGS 4-6 illustrate an alternative embodiment of the invention which differs from the embodiment shown in FIGS. 1-3 in two respects. First, the center one of the pins 18 is replaced with a post 26 which is roughly three times the diameter of a pin. Post 26 is useful to permit the mechanized picking up and placement of the heat sinks by automated assembly equipment. Such equipment might be utilized either by the fabricator of the element who sells the elements with the heat sinks already in place, or by an OEM user of the elements who affixes the heat sinks to the elements before assembling the elements into a final product.

The second difference for this embodiment of the invention is that the projections 16 have been replaced by a pedestal 28 formed integrally with base 14. Pedestal 28 is adapted to be adhesive bonded to element 12 by an adhesive layer 30. The adhesive for layer 30 would be an elastic adhesive of the type previously described. Pedestal 28 is of sufficient size to provide adequate heat flow from element 12 to base 14 while limiting the bonding stress area. As previously indicated, limiting the bonding area reduces the likelihood of the stresses caused by the differing temperature expansion and contraction coefficients of the materials of the heat sink and the element causing a rupture of the element. While the dimensions of pedestal 28 will vary with application, the area of the pedestal might, for example, be roughly one-quarter the area of the base surface. Thus, for the 1.45 inch square pedestal previously indicated, the pedestal 28 might have a diameter of 0.8 inches. The pedestal 28 being adjacent to the hottest area of element 12 optimizes heat transfer from the element to the heat sink.

Except as indicated above, the embodiment of FIGS. 4-6 functions in all respects in the manner previously described for the embodiment of FIGS. 1-3. Further, while the post 26 has been shown with the pedestal 28, a post 26 may also be used with projections 16 and a pedestal 28 may be used with a center pin 18 of the type shown in FIG. 1. The size and shape of the heat sink, and in particular of the base thereof, may also vary with application, and in particular may be circular, oval, rectangular, or some shape other than square. Where the base has a non-uniform shape, the heat sink may not be omnidirectional. Further, the patterns shown for the pins 18 and projections 16 are illustrative only, and the spacing and arrangement of the pins and/or projections may also vary with application. The shape of the projections may also vary.

Thus, while the invention has been shown and described above with respect to preferred embodiments, the foregoing and other changes in form and detail may be made therein by one skilled in the art without departing from the spirit and scope of the invention.

What is claimed is:

1. A heat sink for an element to be cooled comprising:
a base;
a plurality of pins extending substantially perpendicular to the base, said pins being arranged in a predetermined pattern; and
at least one projection integral with said base, extending from the side thereof adjacent the element to be cooled and having an area for the projection surface parallel to the side from which it extends and adapted to make thermal contact with the element to be cooled which is sufficient to provide good thermal transfer between the heat sink and the element while maintaining the area of contact to a fraction of the base area sufficiently small to assure that uneven thermal expansion between the heat sink and element does not cause damage to the element.

2. A heat sink as claimed in claim 1 wherein said pin pattern is symmetrical, whereby the heat sink is omnidirectional.

3. A heat sink as claimed in claim 1 wherein said pin pattern is staggered.

4. A heat sink as claimed in claim 1 wherein said projection is a center pedestal, said pedestal being adapted to be bonded to the element.

5. A heat sink as claimed in claim 1 wherein said projections form a predetermined pattern and are adapted to be in contact with the element.

6. A heat sink as claimed in claim 5 wherein said heat sink is bonded to the element by an adhesive bond, there being a desired thickness for said bond; and
wherein said projections are of a height substantially equal to the desired adhesive bond thickness, providing a controlled space standoff for the adhesive.

7. A heat sink as claimed in claim 1 wherein said base, at least one projection and pins are formed as a single, substantially homogeneous piece of material.

8. A heat sink as claimed in claim 7 wherein said material is a metal.

9. A heat sink as claimed in claim 8 wherein said heat sink is formed by being cast.

10. A heat sink as claimed in claim 9 wherein the metal selected as the material is a metal which is particularly adapted to be cast.

11. A heat sink as claimed in claim 1 wherein said heat sink has a center portion and outer portions, the center portion being adapted to be in contact with a portion of the element which is normally hotter than the portions in contact with the outer areas of the heat sink; and
wherein said heat sink includes means for reducing the resulting temperature gradient between the pins in said center and outer portions.

12. A heat sink as claimed in claim 11 wherein said gradient reducing means includes said base being shaped to provide an improved heat conduction path to the pins extending from the outer portions of the base.

13. A heat sink as claimed in claim 12 wherein the thickness of the base increases in a predetermined way from the center to the periphery of the base.

14. A heat sink as claimed in claim 13 wherein said base is dish-shaped.

15. A heat sink as claimed in claim 14 wherein the height of the pins is greatest in said center portion where said base is of least thickness and decreases for pins toward the periphery which project from portions of the base of increasing thickness, permitting the tops of the pins to be in a common plane parallel to the plane of the base bottom.

16. A heat sink as claimed in claim 1 wherein the center pin is a post, the diameter of the post being greater than that of the pins.

17. A heat sink as claimed in claim 1 wherein the heat sink is particularly adapted for use with integrated circuit elements.

18. A heat sink for an element to be cooled which element has at least one portion which is hotter than other portions of the element comprising:
a base having a central portion and peripheral portions, the base being adapted to be in thermal contact with the element to be cooled with the center portion of the base thermally contacting the hotter portion of said element, the thickness of said base being least in said center portion and increasing in a predetermined way from the center portion to the periphery of the base;

a plurality of pins extending substantially perpendicular to the base, said pins being arranged in a predetermined pattern; and the varying thickness of the base being operative to reduce the temperature gradient between pins over said center portion and pins over said peripheral portions.

19. A heat sink as claimed in claim 18 wherein said base is dish-shaped.

20. A heat sink as claimed in claim 19 wherein the height of the pins is greatest for pins extending from the center of the base where the base is of least thickness and decreases for pins extending from peripheral portions of the base of increasing thickness, permitting the tops of the pins to be in a common plane parallel to the plane of the base bottom.

21. A heat sink as claimed in claim 18 wherein said base and pins are formed as a single substantially homogeneous piece of material.

* * * * *